(12) United States Patent
Morishita et al.

(10) Patent No.: US 6,337,506 B2
(45) Date of Patent: **\*Jan. 8, 2002**

(54) SEMICONDUCTOR MEMORY DEVICE CAPABLE OF PERFORMING STABLE OPERATION FOR NOISE WHILE PREVENTING INCREASE IN CHIP AREA

(75) Inventors: Fukashi Morishita; Teruhiko Amano; Kazutami Arimoto; Tetsushi Tanizaki; Takeshi Fujino; Takahiro Tsuruda; Mitsuya Kinoshita; Mako Kobayashi, all of Hyogo (JP)

(73) Assignee: Mitsubishi Denki Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/116,887

(22) Filed: Jul. 16, 1998

(30) Foreign Application Priority Data

Jan. 28, 1998 (JP) .......................................... 10-016027

(51) Int. Cl.⁷ .............................................. H01L 29/00
(52) U.S. Cl. ........................ 257/500; 257/544; 257/659
(58) Field of Search ................................ 257/500, 659, 257/544, 495, 786, 630

(56) References Cited

U.S. PATENT DOCUMENTS 4,628,343 A * 12/1986 Komatsu ..................... 257/659
5,453,713 A * 9/1995 Partovi et al. ............... 257/552
5,864,168 A * 1/1999 Nasserbakht ................ 257/500

FOREIGN PATENT DOCUMENTS

JP          09-074171          3/1998

OTHER PUBLICATIONS

"A 1.6GB/s Data Rate 1GB Synchronous DRAM with Hierarchical Square–Shaped Memory Block and Distributed Bank Architecture", Nitta et al. 1996 IEEE ISSCC.

* cited by examiner

Primary Examiner—Mark V. Prenty
(74) Attorney, Agent, or Firm—McDermott, Will & Emery

(57) ABSTRACT

A power supply circuit and an oscillation circuit or the like of noise generation sources are concentrated, and the periphery thereof is surrounded by a guard ring. Guard ring is provided to have bonding pads at least partially thereon. Guard ring is effectively provided utilizing the region below bonding pads, so that effective noise reduction is achieved while preventing increase in chip area.

14 Claims, 21 Drawing Sheets

SEMICONDUCTOR MEMORY DEVICE CAPABLE OF PERFORMING STABLE OPERATION FOR NOISE WHILE PREVENTING INCREASE IN CHIP AREA

BACKGROUND OF THE INVENTION

1. Field of the Invention

The present invention relates to semiconductor memory devices, and more particularly to a dynamic random access memory (a DRAM).

2. Description of the Background Art

In a conventional DRAM, a peripheral circuit is arranged to divide a memory cell array into several regions.

FIG. 19 is a diagram showing a circuit arrangement of a conventional DRAM 300.

Referring to FIG. 19, the conventional DRAM 300 includes: memory arrays 302, 304, 306 and 308 arranged in two rows and two columns; power supply circuits 326 and 328 and a control circuit 330 arranged between memory arrays 302, 306 and 304, 308; pads PD11 arranged between memory arrays 302 and 306; and pads PD12 arranged between memory arrays 304 and 308.

Memory array 302 includes memory cell arrays 318, 320, 322 and 324 and array circuits 310, 312, 314 and 316.

In the circuit arrangement shown in FIG. 19, there is a variation in the distances between the peripheral circuit and the array circuits. While a portion F of the array circuit is close to control circuit 330, a portion E of the array circuit is spaced by a significant distance from control circuit 330. Thus, the timing for every control signal must be set in consideration of the delay resulting between the peripheral circuit and portion E of the array circuit, which is spaced by the longest distance from the peripheral circuit.

On the other hand, in Japanese Patent Laying-Open No. 9-74171, a circuit arrangement has been disclosed in which a peripheral circuit is arranged in the central portion of a memory array so as to eliminate variation in signal delays between the peripheral circuit and the array circuits.

FIG. 20 is a schematic diagram shown in conjunction with the circuit arrangement of a conventional DRAM 342 which has been disclosed in the aforementioned laid open application.

Referring to FIG. 20, DRAM 342 includes four unit blocks 344, 346, 348 and 350 arranged in two rows and two columns.

Each of unit blocks 344, 346, 348 and 350 includes eight memory arrays and a peripheral circuit for the memory arrays. More specifically, unit block 344 includes: memory arrays M11, M12 and M13 arranged in the first row; memory arrays M21 and M23 arranged in the second row excluding the area in the second column; memory arrays M31, M32 and M33 arranged in the third row; and a peripheral circuit C1 arranged in the second row of the second column.

As each of unit blocks 346, 348 and 350 has an arrangement similar to that of unit block 344, the description thereof will not be repeated here.

In conventional DRAM 300 shown in FIG. 19, the peripheral circuits (specifically, a control circuit, or a circuit such as a power supply circuit including a charge pump circuit or a ring oscillator) or the like, which are generation sources of electric charges, are distributed over the entire area of the chip. Therefore, electric charges are disadvantageously implanted into the adjacent memory cell through a substrate, resulting in a memory cell which cannot hold data well.

To cope with this problem, a common practice is to provide a guard ring between a peripheral circuit and a memory cell to prevent implantation of electric charges into the memory cell.

FIG. 21 is a diagram showing an arrangement of guard rings in a conventional semiconductor memory device.

Referring to FIG. 21, guard rings 368 and 370 are provided between a peripheral circuit 362 and a memory cell 364 and between peripheral circuit 362 and a memory cell 366, respectively.

FIG. 22 is a diagram showing a cross section taken along the chain-dotted line G–G' for the guard rings in FIG. 21.

Referring to FIG. 22, electric charges 372 generated in peripheral circuit 362 are distributed into a P substrate 374. The distributed electric charges 372 are captured by guard rings 368 and 370 before reaching the memory cell provided adjacent to power supply circuit 362.

In the conventional DRAM, an extra layout area is required to provide the guard rings.

In addition, due to a high frequency signal generated by a ring oscillator, noise may be introduced to an analog circuit within the same chip and transmitted to other semiconductor devices in the same equipment (especially in the same printed circuit board).

FIG. 23 is a circuit diagram showing an oscillator used in a conventional semiconductor memory device.

The ring oscillator includes an NAND circuit 382 receiving a control signal Rin; four inverters 384, 386, 388 and 390 connected in series and receiving an output from NAND circuit 382; and three inverters 392, 394 and 396 connected in series and receiving, inverting and amplifying an output from inverter 390.

An output from inverter 390 is fed back to an input to NAND circuit 382.

FIG. 24 is a diagram showing a circuit arrangement of the ring oscillator shown in FIG. 23.

Referring to FIGS. 23 and 24, NAND circuit 382 includes P channel MOS transistors 382p1 and 382p2 and N channel MOS transistors 382n1 and 382n2.

Inverter 384 includes a P channel MOS transistor 384p and an N channel MOS transistor 384n. Inverter 386 includes a P channel MOS transistor 386p and an N channel MOS transistor 386n.

Inverter 388 includes a P channel MOS transistor 388p and an N channel MOS transistor 388n.

Inverter 390 includes a P channel MOS transistor 390p and an N channel MOS transistor 390n.

Inverter 392 includes a P channel MOS transistor 392p and an N channel MOS transistor 392n.

Inverter 394 includes a P channel MOS transistor 394p and an N channel MOS transistor 394n.

Inverter 396 includes a P channel MOS transistor 396p and an N channel MOS transistor 396n.

The P channel MOS transistors included in the ring oscillator are covered with a second metal interconnection 402 for supplying a power supply potential. The N channel MOS transistors included in the ring oscillator are covered with a second metal interconnection 404 for supplying a ground potential.

For inverter 384, second metal interconnection 402 for supplying the power supply potential is connected to a first metal wiring 414 at a via hole 406. First metal wiring 414 is connected to a source 384ps of P channel MOS transistor 384 at a contact hole 410.

Second metal interconnection 404 for supplying the ground potential is connected to a first metal wiring 416 at a via hole 408. First metal wiring 416 is connected to a source 384ns of N channel MOS transistor 384n at a contact hole 412.

P channel MOS transistor 384p and N channel MOS transistor 384n have their drains 384pd and 384nd connected to a first metal wiring 424 at contact holes 426 and 428, respectively. A first metal wiring 418, to which the output from NAND circuit 382 is applied, is connected to gates 384pg and 384ng of P channel MOS transistor 384p and N channel MOS transistor 384n at contact holes 420 and 422.

Similarly, a first metal wring 424, to which the output from inverter 384 is applied, is connected to gates of P channel MOS transistor 386p and N channel MOS transistor 386n at contact holes.

Thus, an output from inverter 386 is connected to an input to inverter 388, and an output from inverter 388 is connected to an input to inverter 390.

FIG. 25 is a schematic diagram showing a cross section taken along the chain-dotted line X–X' in FIG. 24.

Referring to FIG. 25, a P well 454 is formed on a P substrate 452, and an N channel MOS transistor 384n is formed in P well 454. N channel MOS transistor 384n has its source 456 and drain 458 connected to first metal wirings 416 and 424 at contact holes.

Thereabove, second metal interconnection 404 is formed to cover the ring oscillator through an insulation layer. A protection film 464 is formed on second metal interconnection 404.

The ring oscillator is generally covered with the metal interconnection to which the power supply potential or the ground potential is applied to prevent any influence on the memory cell or to other circuits. The metal wiring used for a usual interconnection is, however, not provided with enough thickness to serve as a satisfactory noise shield.

As described above, in the conventional DRAM, the circuit including the charge pump circuit or the ring oscillator such as the power supply circuit, or the guard ring provided for absorbing electric charges implanted for example by an input/output buffer directly and externally receiving a signal, disadvantageously increases chip area.

In addition, the conventional DRAM is not provided with a satisfactory shield for preventing high frequency noise generated by the ring oscillator or the like to other circuits or to the outside.

SUMMARY OF THE INVENTION

An object of the present invention is to provide a semiconductor device which is not readily influenced by the introduction of noise or electric charges while protecting a memory cells from implanted electric charges as well as protecting memory cells or other circuits and other semiconductor devices from high frequency noise.

Another object of the present invention is to provide a semiconductor device which is provided with sufficient shield to prevent high frequency noise generated by a ring oscillator or the like from being introduced into other circuits or to the outside.

Briefly summarized, the present invention is a semiconductor memory device formed on a semiconductor substrate and including first and second internal circuits, a noise absorbing region and a plurality of pads.

The first internal circuit includes a data holding circuit. The second internal circuit is a noise generation source for the first internal circuit. The noise absorbing region is provided to surround the second internal circuit at least on a main surface of the semiconductor substrate. The plurality of pads are provided to overlap at least part of the noise absorbing region and used for inputting/outputting a signal from/to the outside.

According to another aspect of the present invention, the present invention is a semiconductor memory device formed on a semiconductor substrate and including first and second internal circuits, a noise absorbing region, a conductive supporting member, a shield plate and a conductive adhesion layer.

The second internal circuit is a noise generation source for the first internal circuit. The noise absorbing region is provided to surround the second internal circuit at least on a main surface of the semiconductor substrate. The conductive supporting member is provided on the noise absorbing region to be electrically connected therewith. The shield plate is provided to cover the second internal circuit on the conductive supporting member. The conductive adhesion layer adhesively connects the conductive supporting member and the shield plate.

Therefore, a main advantage of the present invention is that a semiconductor memory device is provided with enhanced noise resistance as data stored in the memory cell can be protected from excessive electric charges or noise generated in a semiconductor memory device per se while preventing increase in chip area by surrounding the circuit of the noise generation source with a guard ring provided below the pads.

Another advantage of the present invention is that a high performance semiconductor memory device with enhanced noise resistance and reduced noise can be implemented in which the concentrated circuits of the noise sources are covered with the shield plate. Thus, data stored in the memory cell is protected from noise generated in the semiconductor memory device per se and noise to be externally transmitted from the chip is greatly reduced.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
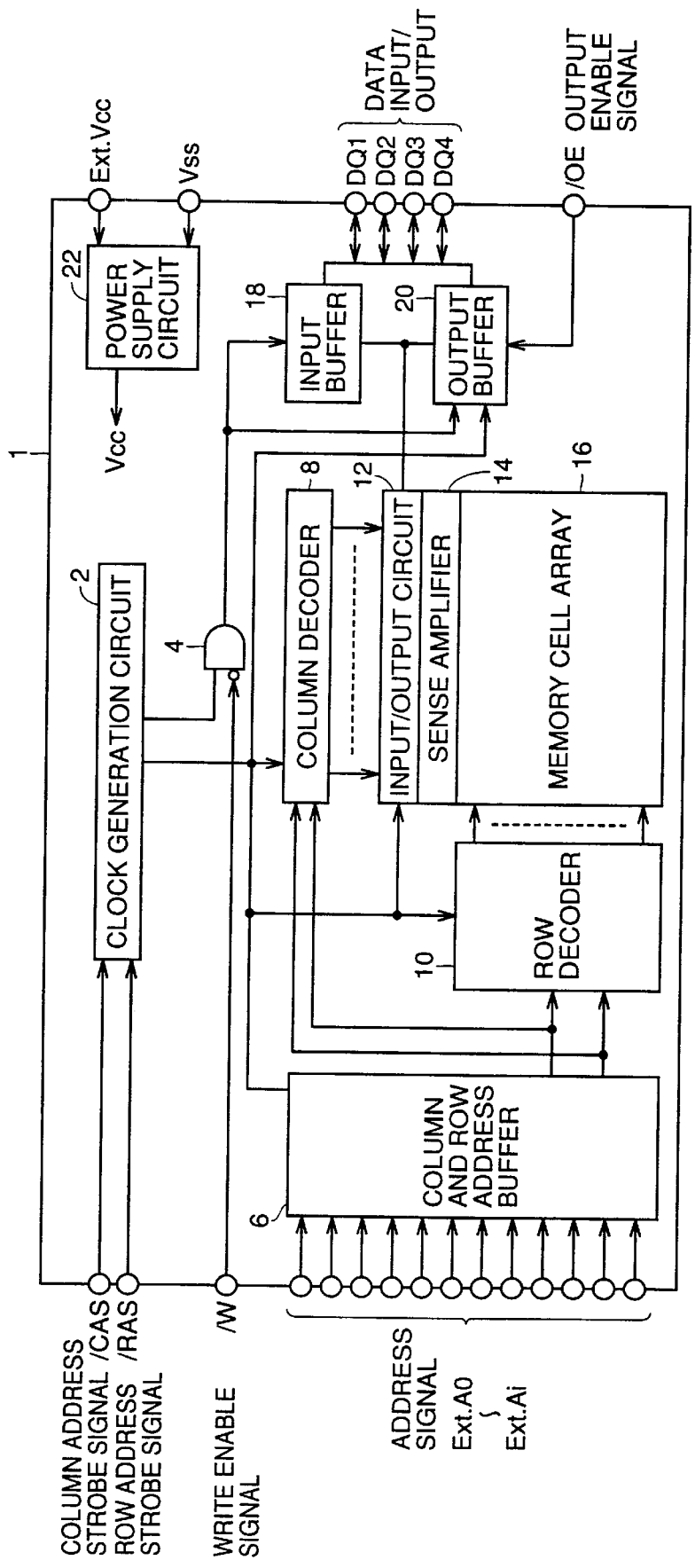
FIG. 1 is a schematic block diagram showing an overall arrangement of a semiconductor memory device 1 in accordance with a first embodiment of the present invention.

The embodiments of the present invention will now be described in detail with reference to the drawings. It is noted that the same or corresponding portions in the figures are denoted by the same reference characters.

First Embodiment

A semiconductor device 1 includes: a memory cell array 16 storing data externally applied; a row and column address buffer 6 receiving address signals Ext.A0 to Ext.Ai designating addresses in memory cell array 16; a row decoder 10 responsive to a row address signal supplied from row and column address buffer 6 for selecting and driving one of a plurality of word lines for memory cell array 16; a column decoder 8 responsive to a column address signal supplied from row and column address buffer 6 for selecting one of a plurality of pairs of bit lines for memory cell array 16; a sense amplifier 14 amplifying potential difference between the pair of bit lines for memory cell array 16; an input buffer 18 receiving and amplifying input data DQ1 to DQ4 externally input; an output buffer 20 externally outputting output data DQ1 to DQ4; and an input/output circuit 12 connecting the pair of bit lines selected by column decoder 8 to input and output buffers 18 and 20.

Input/output circuit 12 supplies a potential of the pair of bit lines selected by column decoder 8 for output buffer 20. Output buffer 20 amplifies and externally outputs the supplied potential as data DQ1 to DQ4.

Input buffer 18 amplifies externally input data DQ1 to DQ4. Input/output circuit 12 supplies data amplified in input buffer 18 for the pair of bit lines selected by column decoder 8.

Row and column address buffer 6 selectively supplies externally supplied address signals Ext.A0 to Ext.Ai for row and column decoders 10 and 8.

Semiconductor device 1 further includes: a clock generation circuit 2 receiving column and row address strobe signals /CAS and /RAS for generating operation timing for an internal circuit; a gate circuit 4 receiving a write control signal /W and activating/inactivating input and output buffers 18 and 20 in accordance with the value of write control signal /W; and a power supply circuit 22 receiving an external power supply potential Ext.Vcc and a ground potential Vss for generating an internal power supply potential Vcc.

Figure 2:
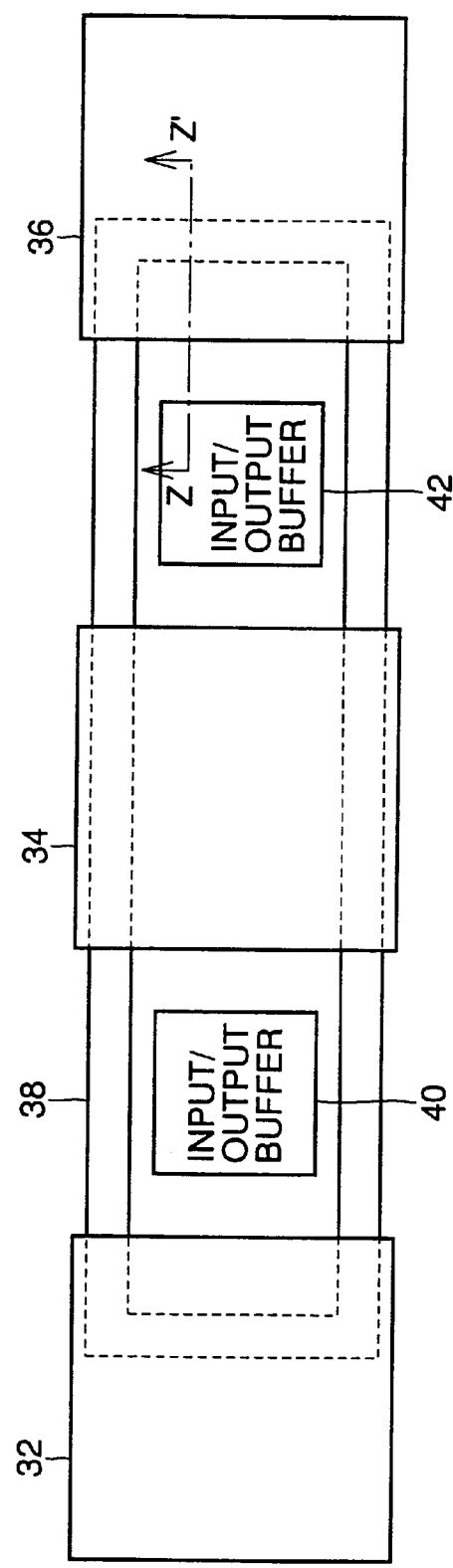
FIG. 2 is a diagram showing an arrangement of a guard ring used in semiconductor memory device 1 in accordance with the first embodiment.

Referring to FIG. 2, the semiconductor memory device includes pads 32, 34 and 36, input/output buffers 40 and 42 and a guard ring 38. Input/output buffer 40 is provided between pads 32 and 34 receiving data input/output. Input/output buffer 42 is provided between pads 34 and 36 receiving data input/output.

Each of input/output buffers 40 and 42 has input and output buffers shown in FIG. 1, each corresponding to one bit.

Input/output buffers 40 and 42 are surrounded by guard ring 38. Guard ring 38 is at least partially underlying pads 32, 34 and 36. While guard ring 38 is shown as partially underlying the pads, the entire portion of the guard ring may be provided below the pads.

Figure 3:
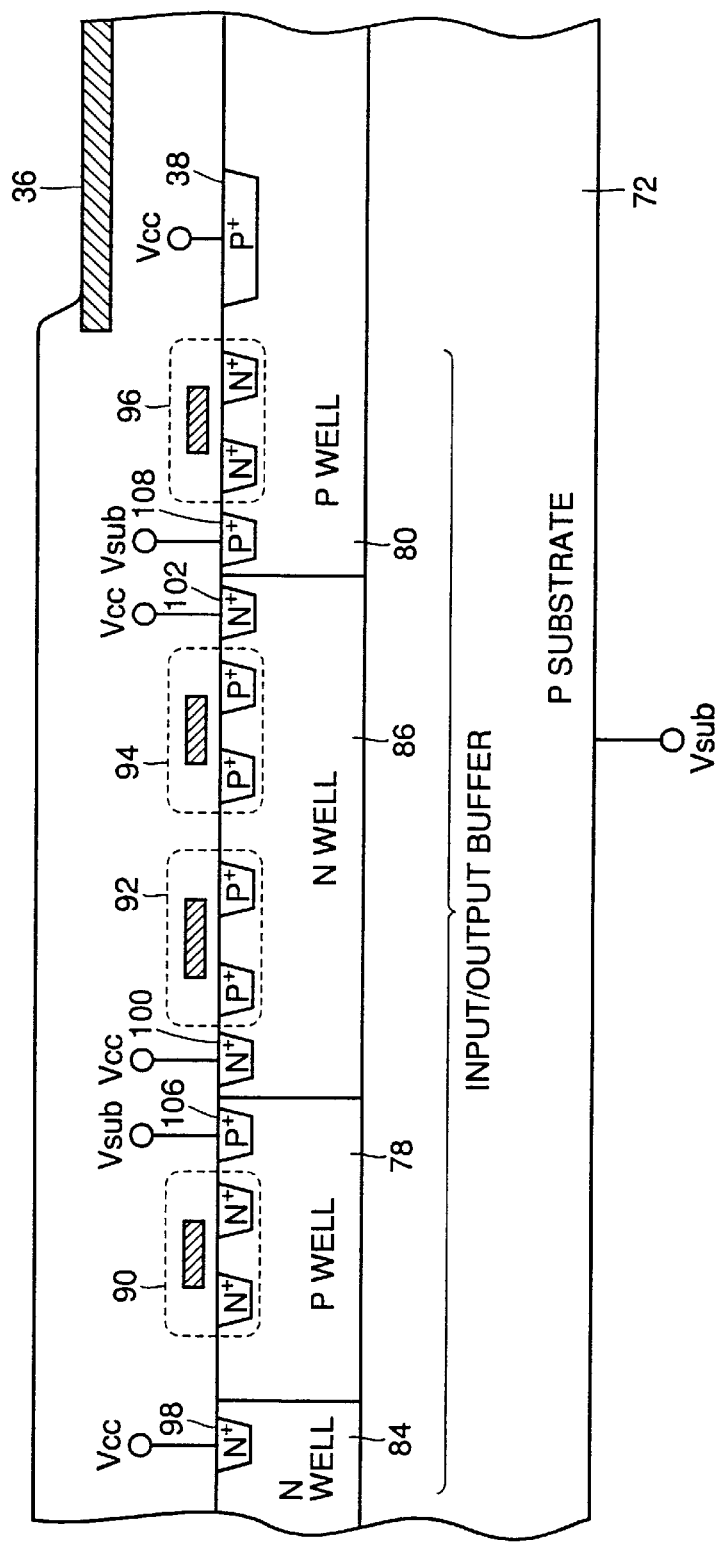
FIG. 3 is a view showing a cross section taken along the chain-dotted line Z–Z' in FIG. 2.

Referring to FIG. 3, P wells 78 and 80 are formed on a P substrate 72. Thereafter, N wells 84 and 86 are formed.

N channel MOS transistors 90 and 96 are formed in P wells 78 and 80, respectively. In addition, P wells 78 and 80 have their potentials fixed at a substrate potential Vsub by P type impurity regions 106 and 108.

P channel MOS transistors 92 and 94 are formed in N well 86. N well 86 has its potential fixed at internal power supply potential Vcc by N type impurity regions 100 and 102.

Similarly, N well 84 has its potential fixed at internal power supply potential Vcc by an N type impurity region 98.

In the periphery of the input/output buffer, guard ring 38 is formed in P well 80 having a large width for stabilizing the potential of the well and capturing externally implanted electric charges. Guard ring 38 is formed of a P type impurity region and can be formed through the same process as that for P type impurity regions 106 and 108.

A pad 36 is formed above guard ring 38.

As a pad is used for directly receiving or supplying an input or output signal from or for the outside, a large amount of noise may be generated in the vicinity thereof.

Thus, electric charges may be implanted to the input/output buffer directly receiving the signal from the pad due to noise, and the potential of the well region in which the input/output buffer is formed may be rendered unstable.

Then, the guard ring with a resistance value lower than that for the well is provided in the periphery of the input/output buffer to absorb the implanted electric charges.

A circuit including the metal wiring or the like is not provided under the pad because of the stress during bonding. Thus, the region under the pad is in most cases not effectively utilized.

For the arrangement shown in FIG. 2, as most of the guard ring is provided under the pad, increase in chip area (area penalty) of the semiconductor memory device due to the provision of the guard ring is significantly prevented.

This may also be applied to an address signal terminal, a write control signal terminal, a column address strobe signal terminal and a row address strobe signal terminal, all externally receiving a signal.

FIGS. 4 to 7 are diagrams showing arrangements of the pads to which the arrangement of the guard ring in FIG. 2 can be applied.

Figure 4:
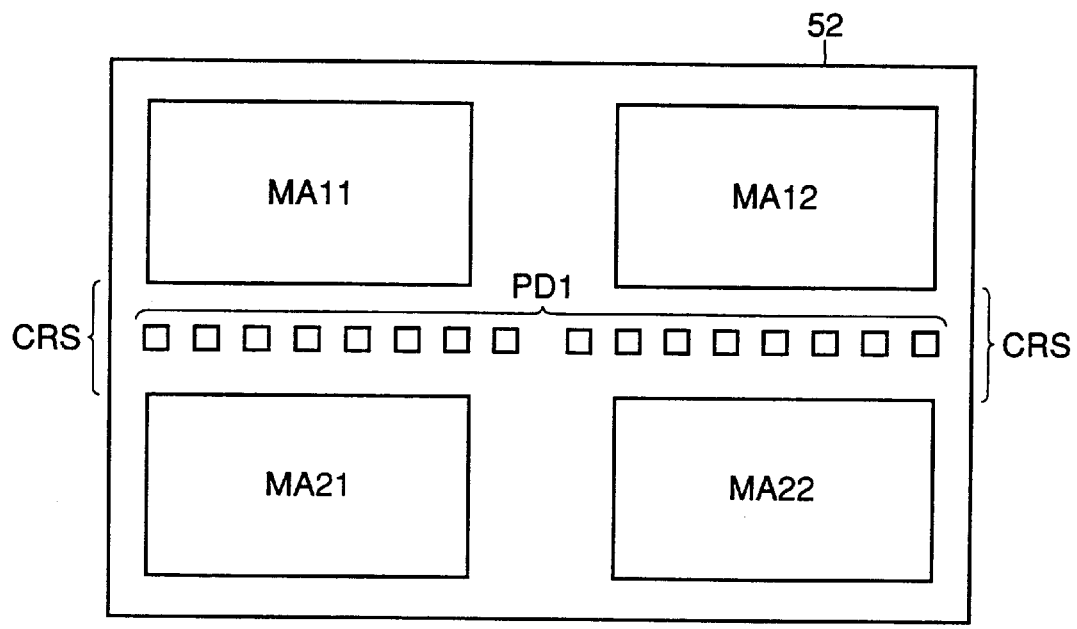
FIGS. 4 to 7 are diagrams showing first to fourth exemplary pad arrangements of the semiconductor memory device in accordance with the first embodiment.

FIG. 4 is a first exemplary arrangement of the pads.

Referring to FIG. 4, four memory arrays MA11, MA12, MA21 and MA22 are arranged on a semiconductor substrate 52, and pads PD1 are arranged in a central region CRS extending in the middle portion of semiconductor substrate 52 in parallel to its longer sides.

Figure 5:
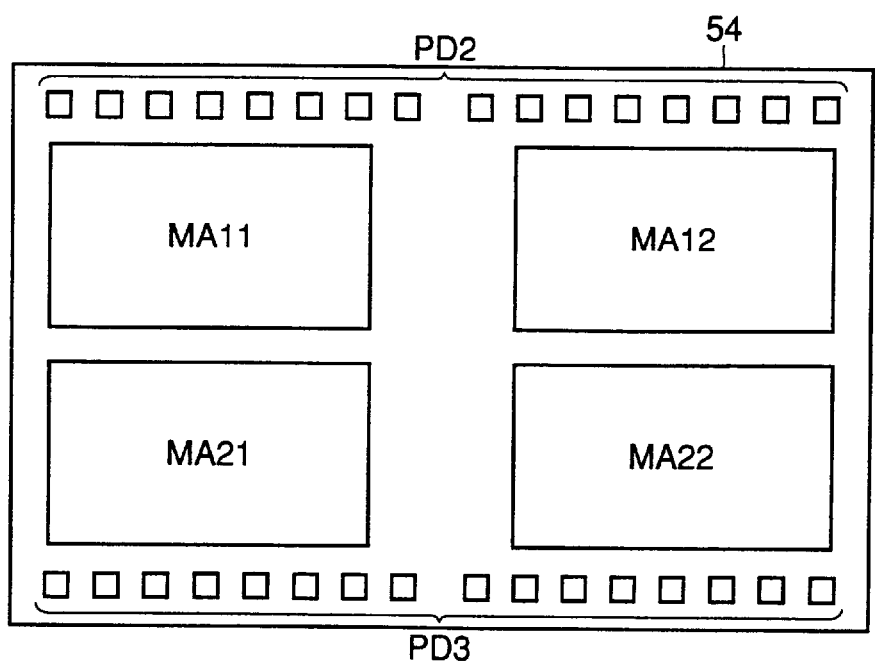

FIG. 5 is a diagram showing a second exemplary arrangement of pads.

Referring to FIG. 5, four memory arrays MA11, MA12, MA21 and MA22 are arranged on a semiconductor substrate 54, and pads PD2 and PD3 are respectively arranged along two longer sides of semiconductor substrate 54.

Figure 6:
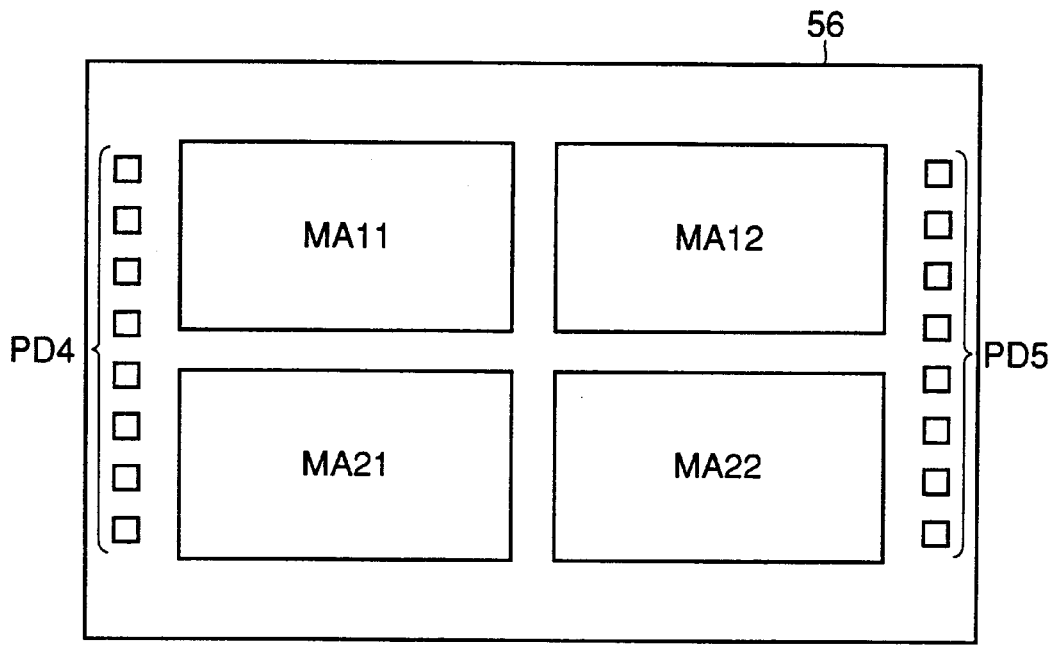

FIG. 6 is a diagram showing a third exemplary arrangement of pads.

Four memory arrays MA11, MA12, MA21 and MA22 are arranged on a semiconductor substrate 56, and pads PD4 and PD5 are respectively arranged along two shorter sides of semiconductor substrate 56.

Figure 7:
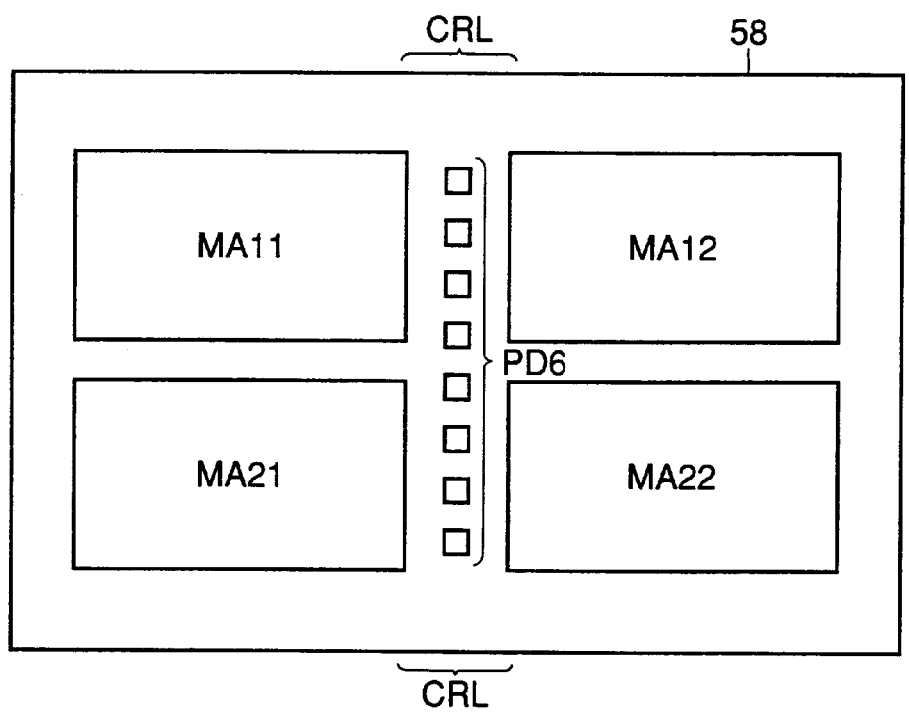

FIG. 7 is a diagram showing a fourth exemplary arrangement of pads.

Four memory arrays MA11, MA12, MA21 and MA22 are arranged on a semiconductor substrate 58, and pads PD6 are arranged in a central region CRL extending in the middle portion of semiconductor substrate 58 in parallel to its shorter sides.

The arrangement of the guard ring shown in FIG. 2 can be applied to all of the arrangements of pads shown in FIGS. 4 to 7.

Second Embodiment

Figure 8:
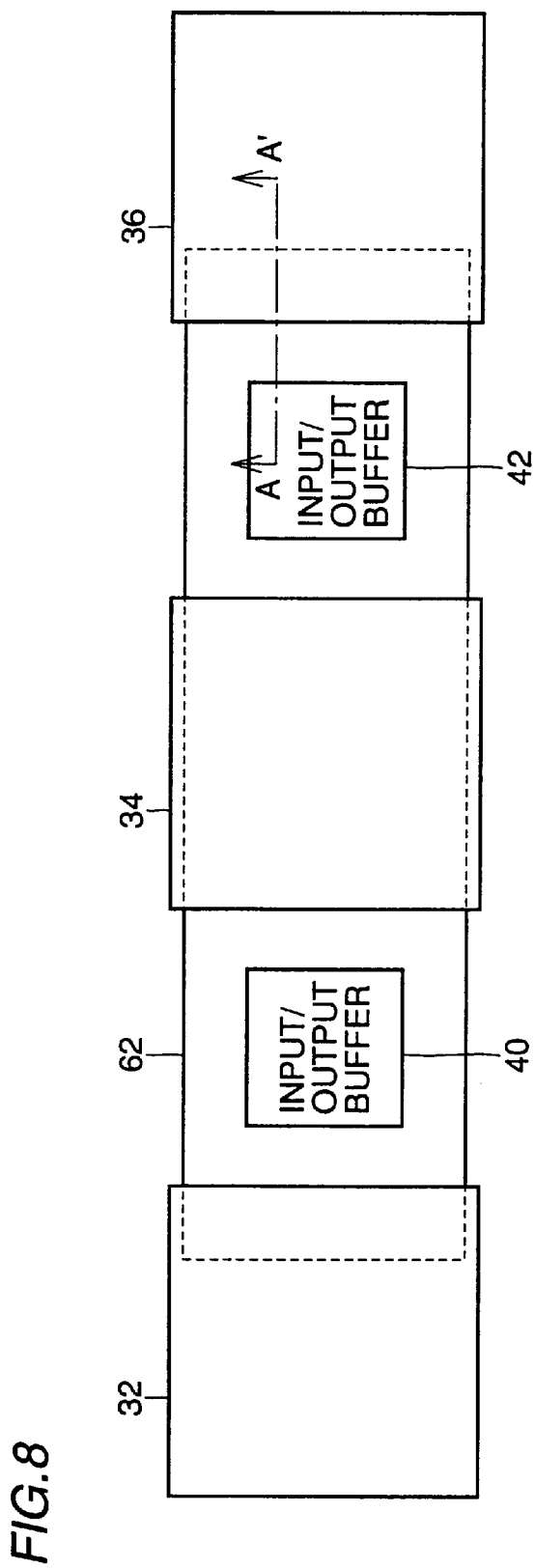
FIG. 8 is a diagram showing an arrangement of a pad and an input/output buffer in a semiconductor device in accordance with a second embodiment of the present invention.

Referring to FIG. 8, a semiconductor memory device includes pads 32, 34 and 36, input/output buffers 40 and 42, and a triple-well formation region 62. Input/output buffer 40 is arranged between pads 32 and 34. Input/output buffer 42 is arranged between pads 34 and 36. The second embodiment differs from the first embodiment in that input/output buffers 40 and 42 are arranged in triple-well formation region 62, which will later be described.

Figure 9:
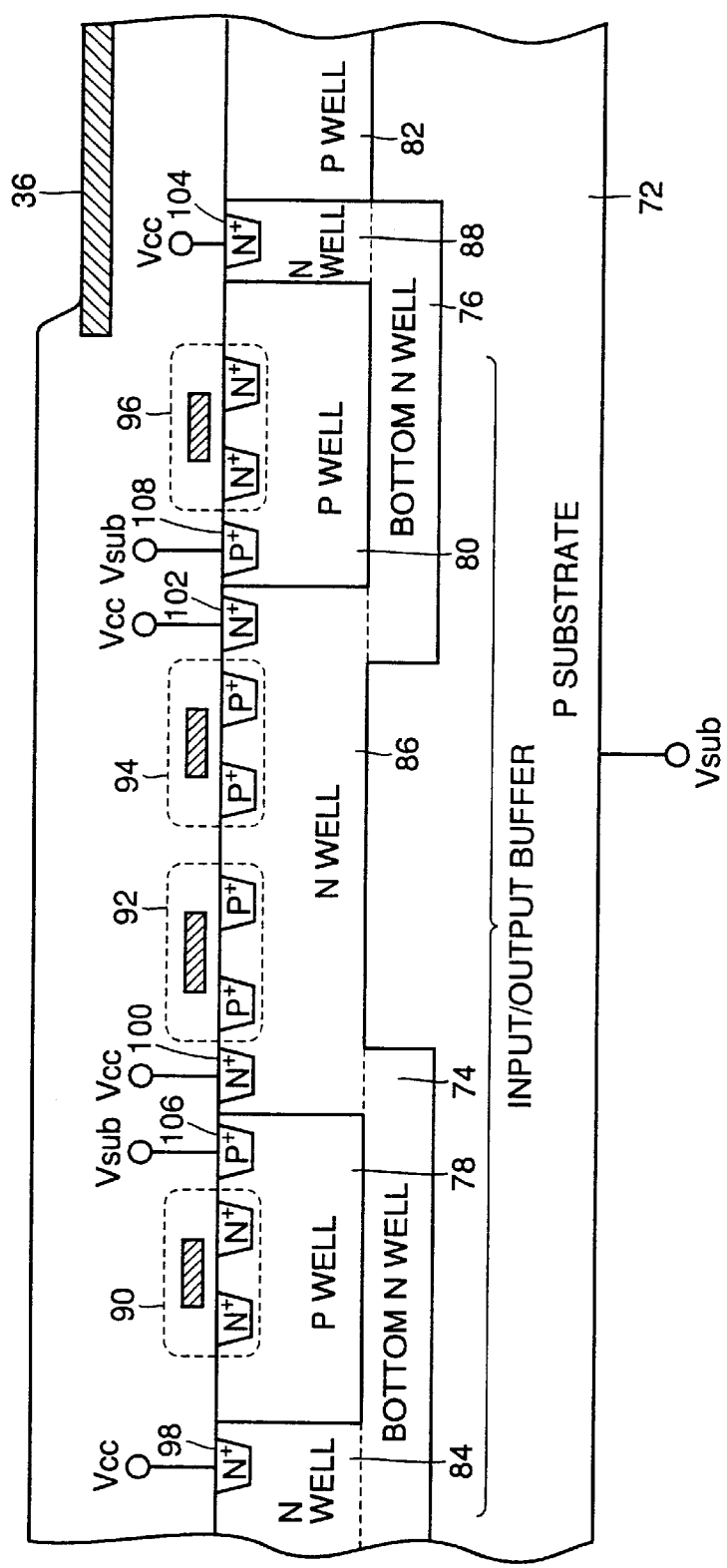
FIG. 9 is a view showing a cross section taken along the chain-dotted line A–A' in FIG. 8.

Referring to FIG. 9, bottom N wells 74 and 76 are formed on a P substrate 72 by implantation of an N type impurity. Then, P wells 78, 80 and 82 are formed. Thereafter, N wells 84, 86 and 88 are formed.

N channel MOS transistors 90 and 96 are respectively formed in P wells 78 and 80. P wells 78 and 80 have their potentials fixed at a substrate potential Vsub by P type impurity regions 106 and 108, respectively.

P channel MOS transistors 92 and 94 are formed in an N well 86. N well 86 has its potential fixed at an internal power supply potential Vcc by N type impurity regions 100 and 102.

Similarly, N wells 84 and 88 have their potentials fixed at internal power supply potential Vcc by N type impurity regions 98 and 104, respectively. P well 82 has its potential fixed at substrate potential Vsub through the P substrate.

A pad 36 is formed on N well 88, which is an isolation region.

Conditions for forming the wells and the impurity regions are as follows. The bottom N well is formed using P (phosphorus) with a dosage of 1e13/cm² and implantation energy of about 3 MeV. The N well is formed using P (phosphorus) with a dosage of 1e13/cm² and implantation energy of about 1.1 MeV. The P well is formed using B (boron) with a dosage of 1e13/cm² and implantation energy of about 0.7 MeV. The N type impurity region is formed using As with a dosage of 4e15/cm² and implantation energy of about 50 keV. The P type impurity region is formed using $BF_2$ (boron fluoride) with a dosage of 4e15/cm² and implantation energy of about 20 keV.

The cross section in FIG. 9 shows a so called triple-well structure in which bottom N wells 74 and 76 electrically isolate the bottoms of P wells 78 and 80 from P substrate 72. In addition, the sides of P wells 78 and 80 are in contact with the N wells, which are in turn connected to the bottom N wells, so that P wells 78 and 80 can be electrically isolated from P substrate 72 and P well 82 by bottom N wells 74 and 76 as well as N wells 84, 86 and 88.

Assuming that the region of the P well electrically isolated from the P substrate by the bottom N well is referred to as a triple-well formation region, then, input/output circuits 40 and 42 are arranged in a triple-well formation region 62 in FIG. 8.

Thus, even when electric charges due to external noise are implanted to the transistor portion formed in the P well region of the input/output buffer, which is receiving the noise applied to the pad, the implanted electric charges rarely reach the P substrate through the bottom N well as the P well of the input/output buffer is isolated from the P substrate by the bottom N well. With such triple-well structure, a greater effect of absorbing electric charges can be obtained as compared with the case of the guard ring described in conjunction with the first embodiment.

The formation of the N well electrically isolating P well 82 and P substrate 72 is, however, not limited to the triple-well structure in which the bottom N well is preliminary formed. Any N well may be employed as long as it surrounds the bottom and all the sides of the P well.

However, an isolation region must be provided in the periphery of the triple-well formation region which isolates the general P well from the P well within the triple-well formation region. The N well 88 corresponds to the isolation region in FIG. 9. The isolation region requires at least about five microns in width, and it is not practical to have all the regions where noise-generating circuits are formed within the triple-well formation region even if it is effective for absorption of electric charges. This is because such structure would increases area penalty.

In the second embodiment shown in FIG. 8, most of the isolation region is formed below the pads, so that the input/output buffer can be provided in the triple-well formation region without significant increase in area of the semiconductor device.

Third Embodiment

Figure 10:
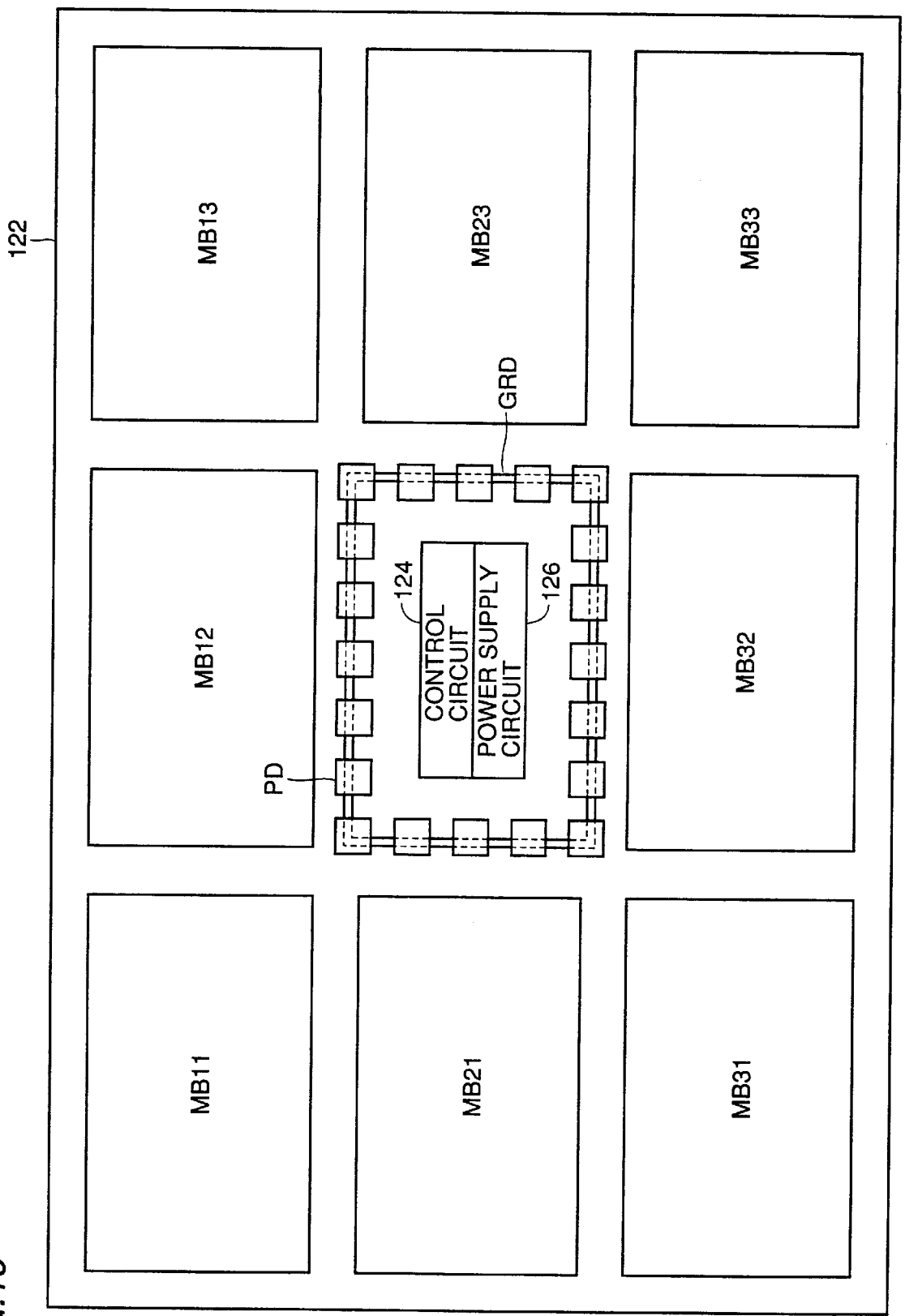
FIG. 10 is a schematic diagram showing a circuit arrangement of a semiconductor memory device in accordance with a third embodiment of the present invention.

Referring to FIG. 10, a semiconductor memory device is provided with peripheral circuits including a control circuit and a power supply circuit in a region surrounded by memory arrays, and pads for bonding are provided to surround the peripheral circuits.

More specifically, memory arrays MB11, MB12, MB13, MB21, MB23, MB31, MB32 and MB33 are arranged in eight regions on semiconductor substrate 122 which is roughly divided into nine regions in three rows and three columns, excluding the region in the second row of the second column. In the region in the second row of the second column, control circuit 124 and power supply circuit 126 are arranged in the central portion thereof, which are surrounded by pads PD. In addition, a guard ring GRD formed of a P type impurity region is provided immediately below and along the pads, with its potential fixed at the same potential as that of the substrate.

The third embodiment differs from the first embodiment in the above described respects.

Figure 11:
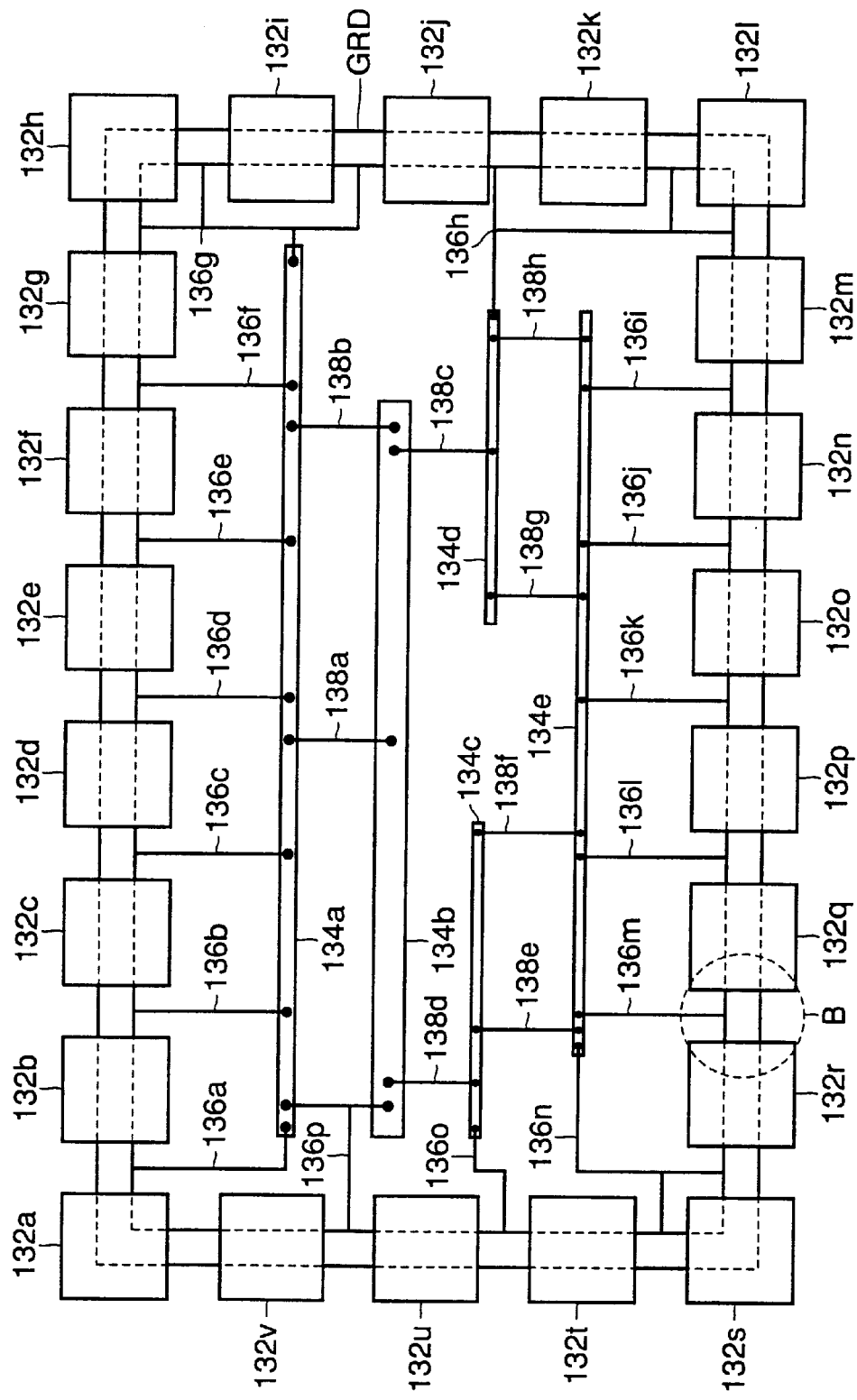
FIG. 11 is a diagram showing in enlargement a connection between a guard ring GRD and a ground line in FIG. 10.

FIG. 11 is a diagram showing in enlargement the pads and the guard ring arranged in the region in the second row of the second column in FIG. 10.

Referring to FIG. 11, pads 132a to 132v are provided in a rectangular form to surround the peripheral circuits. Guard ring GRD, formed of the P type impurity region, is provided immediately below and along pads 132a to 132v.

In addition, ground lines 134a to 134e, which are formed of second metal interconnections used in the peripheral circuits, are formed in the region surrounded by the pads. Ground lines 134a to 134e are mutually connected through ground lines 138a to 138h formed of first metal interconnections. Further, ground lines 134a to 134e of the second metal interconnections are connected to guard ring GRD between the pads through ground lines 136a to 136p of the first metal interconnections, with the potential of guard ring GRD fixed at a ground potential.

Figure 12:
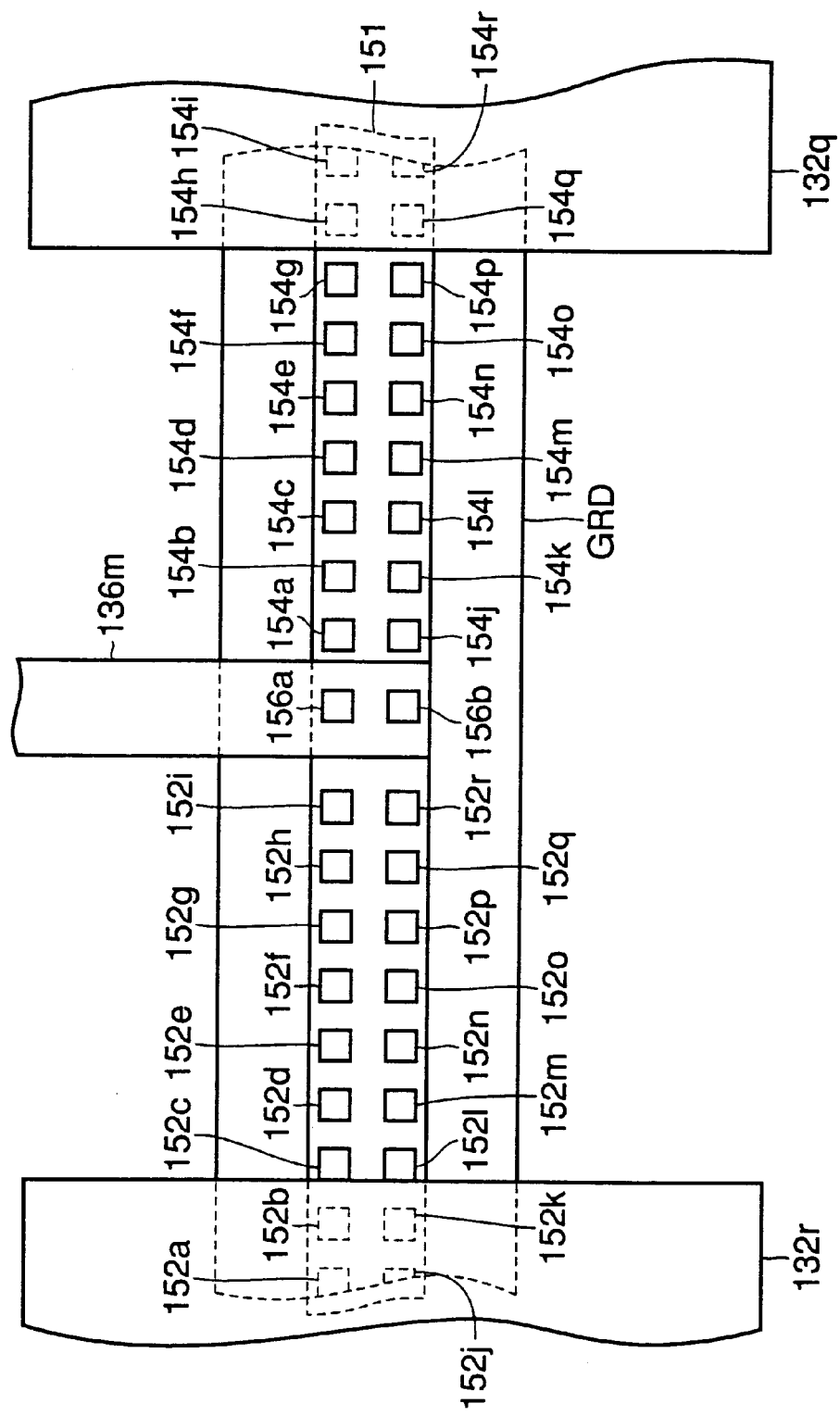
FIG. 12 is a diagram showing in enlargement a portion B in FIG. 11.

FIG. 12 is a diagram showing in enlargement the detail of a portion B in FIG. 11.

A ground line 136m formed of first metal is connected to an interconnection 151 formed of polysilicon through contact holes 156a and 156b between pads 132r and 132q.

Thus, the ground potential is applied to polysilicon interconnection 151.

Though the pads. are formed of the second metal interconnections, they are subject to stress during bonding. The use of the first metal interconnection therebelow may result in disconnection, so that the polysilicon interconnection below the first metal interconnection is used for grounding of the guard ring.

As polysilicon interconnection 151 is connected to guard ring GRD of the P type impurity region through contact holes 152a to 152r as well as contact holes 154a to 154r, guard ring GRD is fixed at the ground potential.

With the provision of the guard ring described above, excessive electric charges generated for example in the power supply circuit can be rapidly absorbed by the guard ring faster than a rate of generation, whereby transmission of excessive electric charges to the memory cell which is spaced by the guard ring is prevented.

Figure 21:
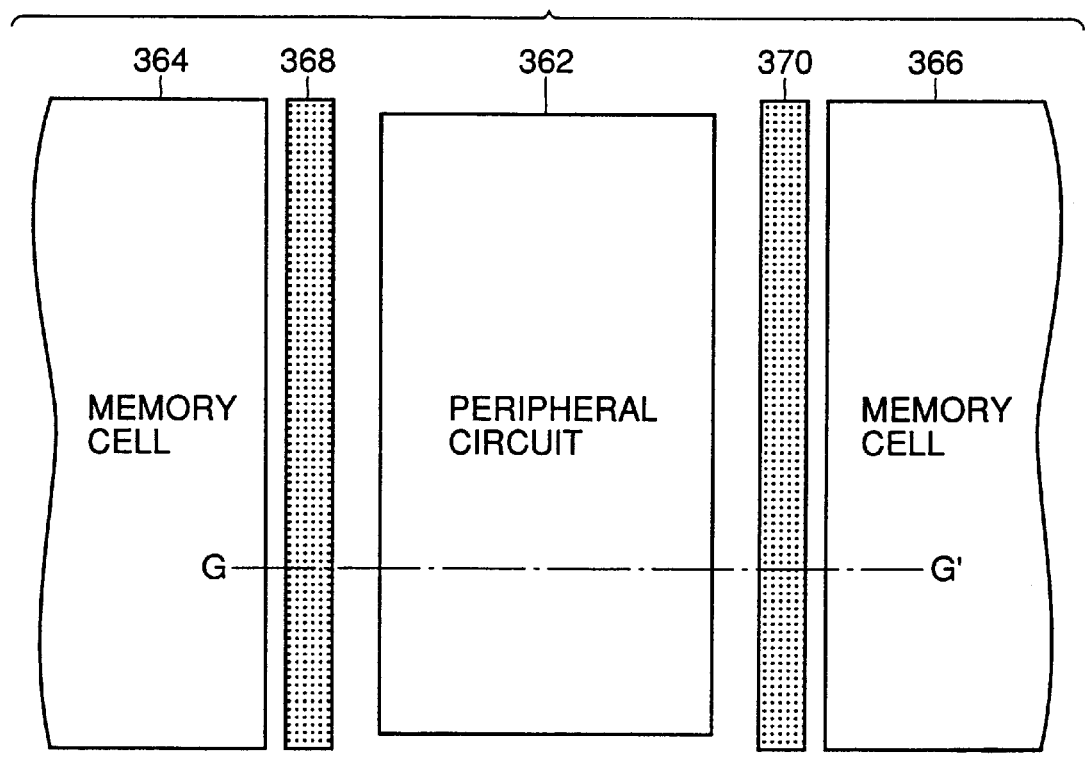
FIG. 21 is a schematic diagram shown in conjunction with an arrangement of a guard ring in a conventional semiconductor memory device.
Figure 22:
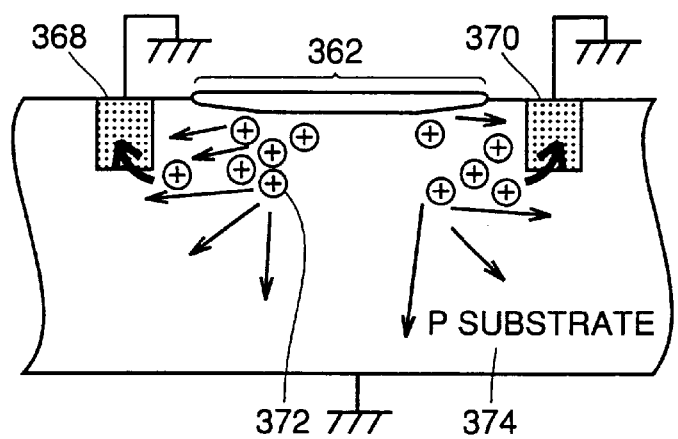
FIG. 22 is a diagram showing a cross section taken along the chain-dotted line G–G' in FIG. 21.
Figure 23:
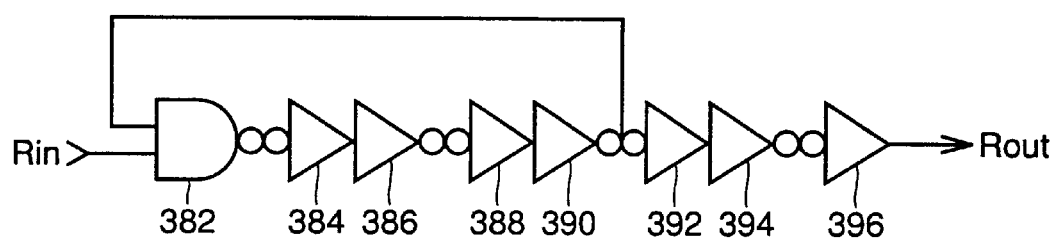
FIG. 23 is a circuit diagram showing a ring oscillator used in the conventional semiconductor memory device.
Figure 24:
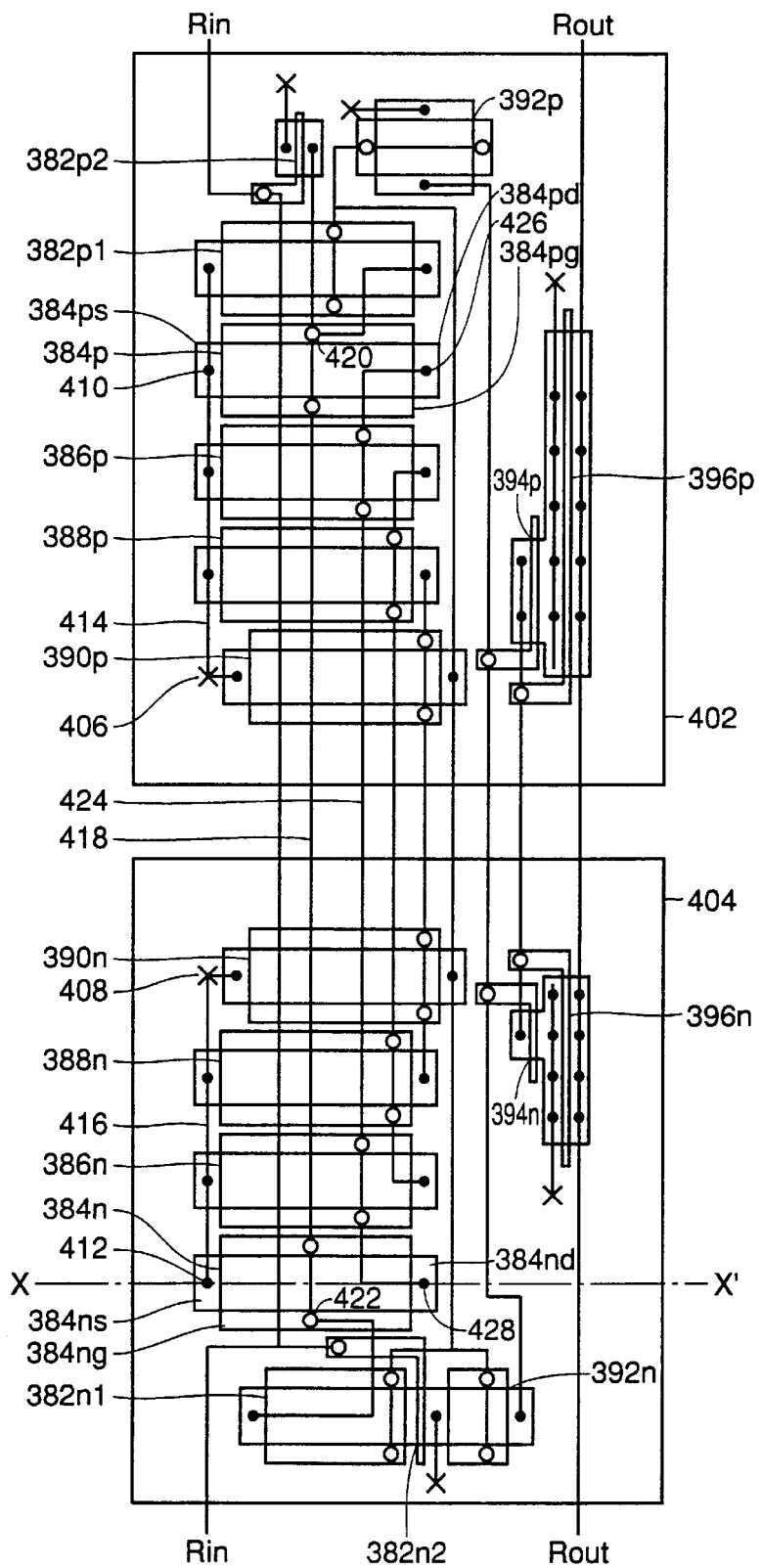
FIG. 24 is a schematic diagram showing a circuit arrangement of the ring oscillator in FIG. 23.
Figure 25:
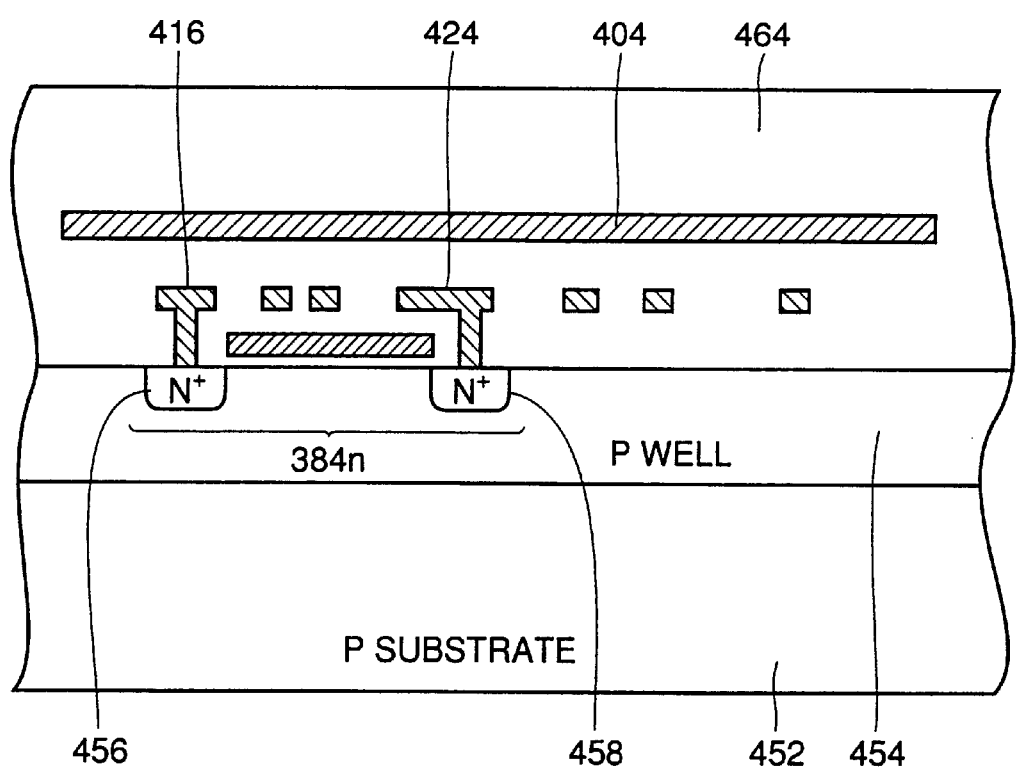
FIG. 25 is a schematic diagram showing a cross section taken along the chain-dotted line X–X' in FIG. 24.

As the guard ring is provided below the pads, increase in layout area as shown in FIG. 21 is prevented and layout efficiency is increased.

In addition, with the arrangement in the third embodiment, absorption of excessive electric charges is ensured as generation sources of excessive electric charges are concentrated and the periphery of the power supply circuit portion is surrounded by the guard ring with a large width to sufficiently utilize the large area immediately below the pads.

Fourth Embodiment

Figure 13:
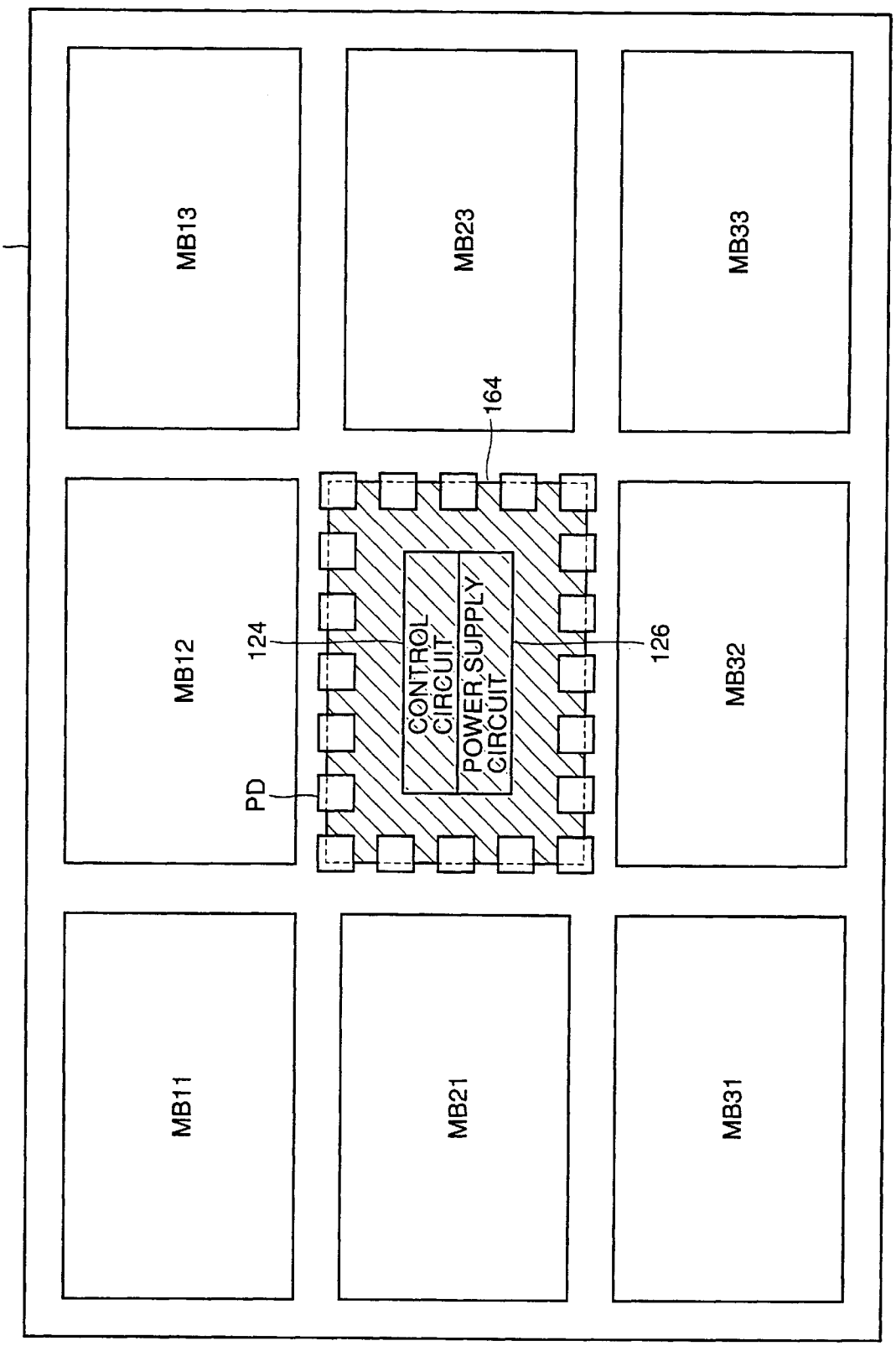
FIG. 13 is a schematic diagram showing a circuit arrangement of a semiconductor device in accordance with a fourth embodiment of the present invention.

Referring to FIG. 13, a semiconductor memory device in accordance with the fourth embodiment differs from that in accordance with the third embodiment in that control circuit 124 and power supply circuit 126 arranged in the middle portion are formed within triple-well formation region 164.

Figure 14:
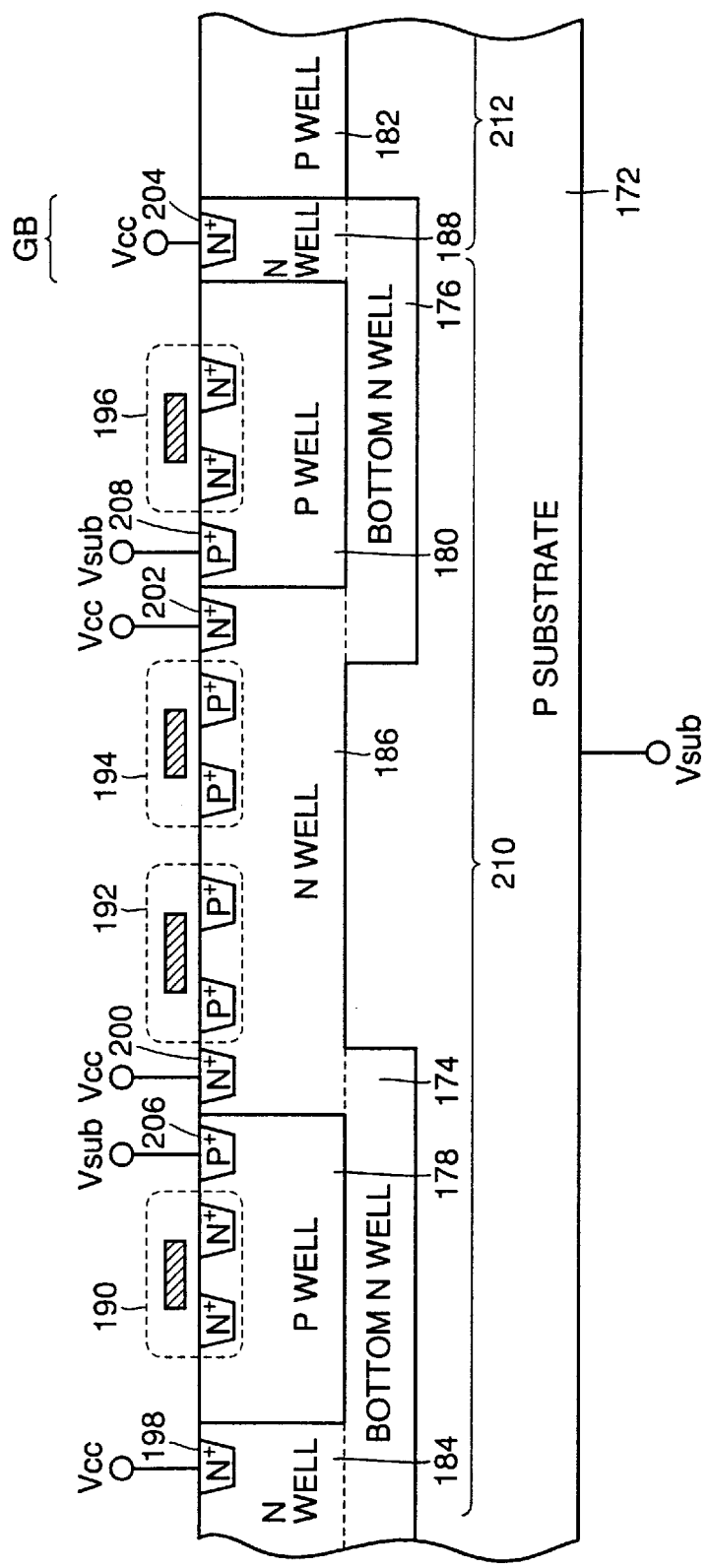
FIG. 14 is a view showing a cross section of a triple-well structure.

Referring to FIG. 14, bottom N wells 174 and 176 are formed by implantation of an N type impurity on a P substrate 172. Then, P wells 178, 180 and 182 are formed. Thereafter, N wells 184, 186 and 188 are formed.

N channel MOS transistors 190 and 196 are respectively formed in P wells 178 and 180. P wells 178 and 180 have their potentials fixed at a substrate potential Vsub by P type impurity regions 206 and 208, respectively.

P channel MOS transistors 192 and 194 are formed in an N well 186. N well 186 has its potential fixed at an internal power supply potential Vcc by N type impurity regions 200 and 202.

Similarly, N wells 184 and 188 have their potentials fixed at internal power supply potential Vcc by N type impurity regions 198 and 204, respectively. P well 182 has its potential fixed at substrate potential Vsub through the P substrate.

Pads PD are formed on N well 188, which is an isolation region.

Conditions for forming the wells and impurity regions are as follows, as in the second embodiment. The bottom N well is formed using P (phosphorus) with a dosage of 1e13/cm$^2$ and implantation energy of about 3 MeV. The N well is formed using P (phosphorus) with a dosage of 1e13/cm$^2$ and implantation energy of about 1.1 MeV. The P well is formed using B (boron) with a dosage of 1e13/cm$^2$ and implantation energy of about 0.7 MeV. The N type impurity region is formed using As with a dosage of 4e15/cm$^2$ and implantation energy of about 50 keV. The P type impurity region is formed using BF$_2$ (boron fluoride) with a dosage of 4e15/cm$^2$ and implantation energy of about 20 keV.

Peripheral circuits including a power supply circuit, a control circuit and an input/output buffer are formed in a triple-well formation region 210 in FIG. 14, and a memory array is generally arranged in a region 212.

In other words, to prevent implantation of excessive electric charges generated in power supply circuit 126 to the memory cell array, the power supply circuit is formed on the P well, on which the memory array is not formed, so that the generated electric charges cannot flow out of the P well.

In the semiconductor memory device according to the fourth embodiment, increase in layout area is prevented as an isolation region GB for the P well of the memory array and the P well within the triple-well formation region on which the power supply circuit is formed is provided below the pads. Thus, electric charges can be absorbed efficiently as in the case for the third embodiment.

While only two P wells 178 and 180 are shown in FIG. 14 as the P well regions in which N channel MOS transistors are formed in the triple-well formation regions, and only one N well 186 is shown as the N well region in which the P channel MOS transistors are formed, a larger number of wells are actually provided. A width of N well 188 in a column form for isolating P well 182 in which the memory cell (not shown) is formed from the P well in which the power supply circuit is formed must be about 5 μm, and the most of the area penalty is saved below the pads according to the present invention.

Fifth Embodiment

Figure 15:
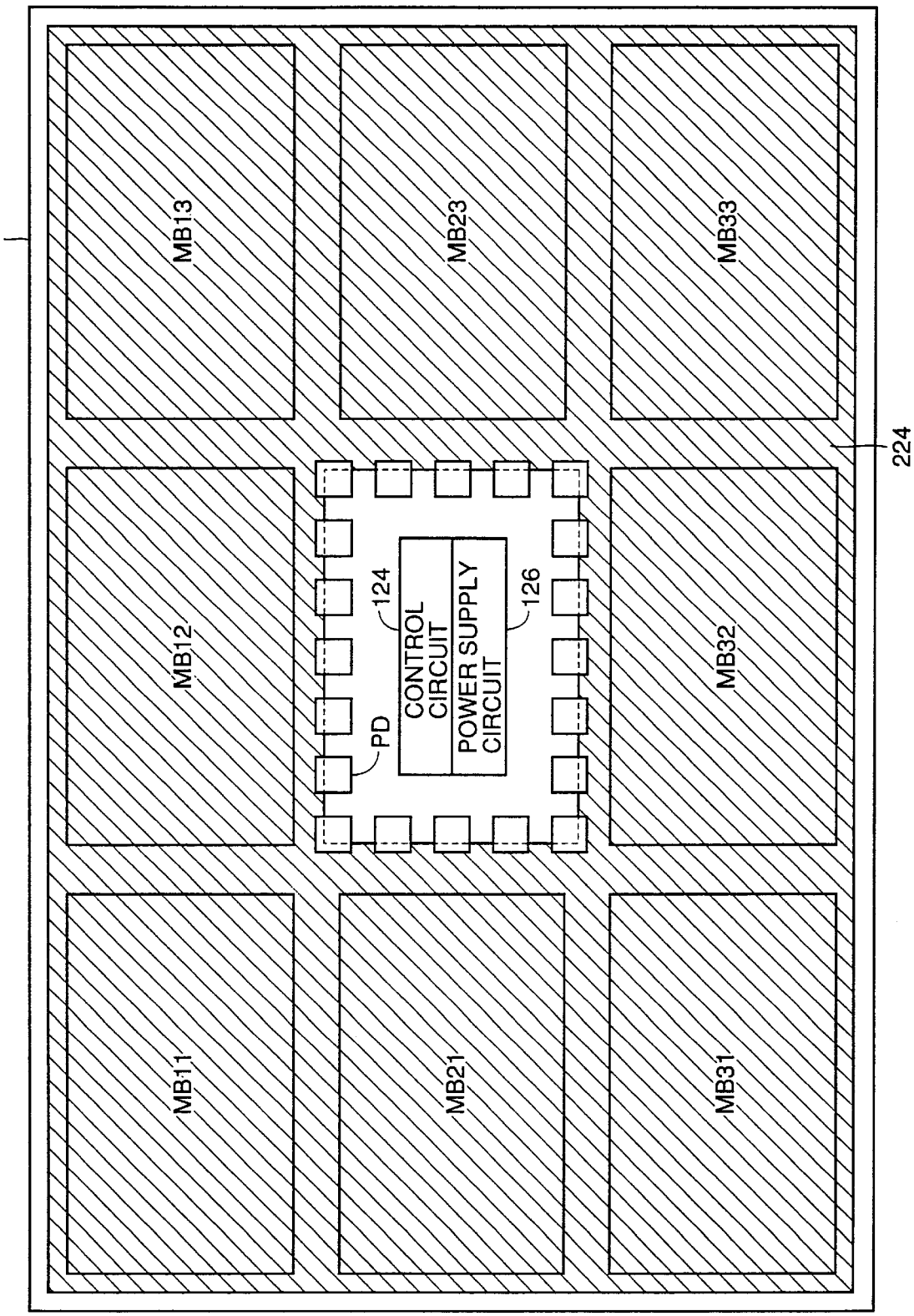
FIG. 15 is a schematic diagram showing a circuit arrangement of a semiconductor memory device in accordance with a fifth embodiment of the present invention.

Referring to FIG. 15, a semiconductor memory device according to the fifth embodiment of the present invention differs from that of the fourth embodiment in that the region in the second row of the second column in which the triple-well is formed in the semiconductor memory device of the fourth embodiment is used as a general region, and the regions, excluding that in the second row of the second column, in which the memory arrays are formed are used as triple-well formation region.

In the fourth embodiment, transmission of the generated excessive electric charges are prevented by providing the power supply circuit, which is a generation source of excessive electric charges, in the triple-well formation region. On the other hand, the semiconductor memory device of the fifth embodiment has a totally different structure in which implantation of electric charges from a substrate to the memory cell is prevented by providing the memory array which is subject to the generated electric charges in the triple-well formation region.

A similar effect can be obtained in the case for the fifth embodiment as in the fourth embodiment.

Sixth Embodiment

A semiconductor memory device in accordance with the sixth embodiment differs from that of the third embodiment in the structure in the region surrounded by the pads arranged in the second row of the second column of the semiconductor device of the third embodiment.

Figure 16:
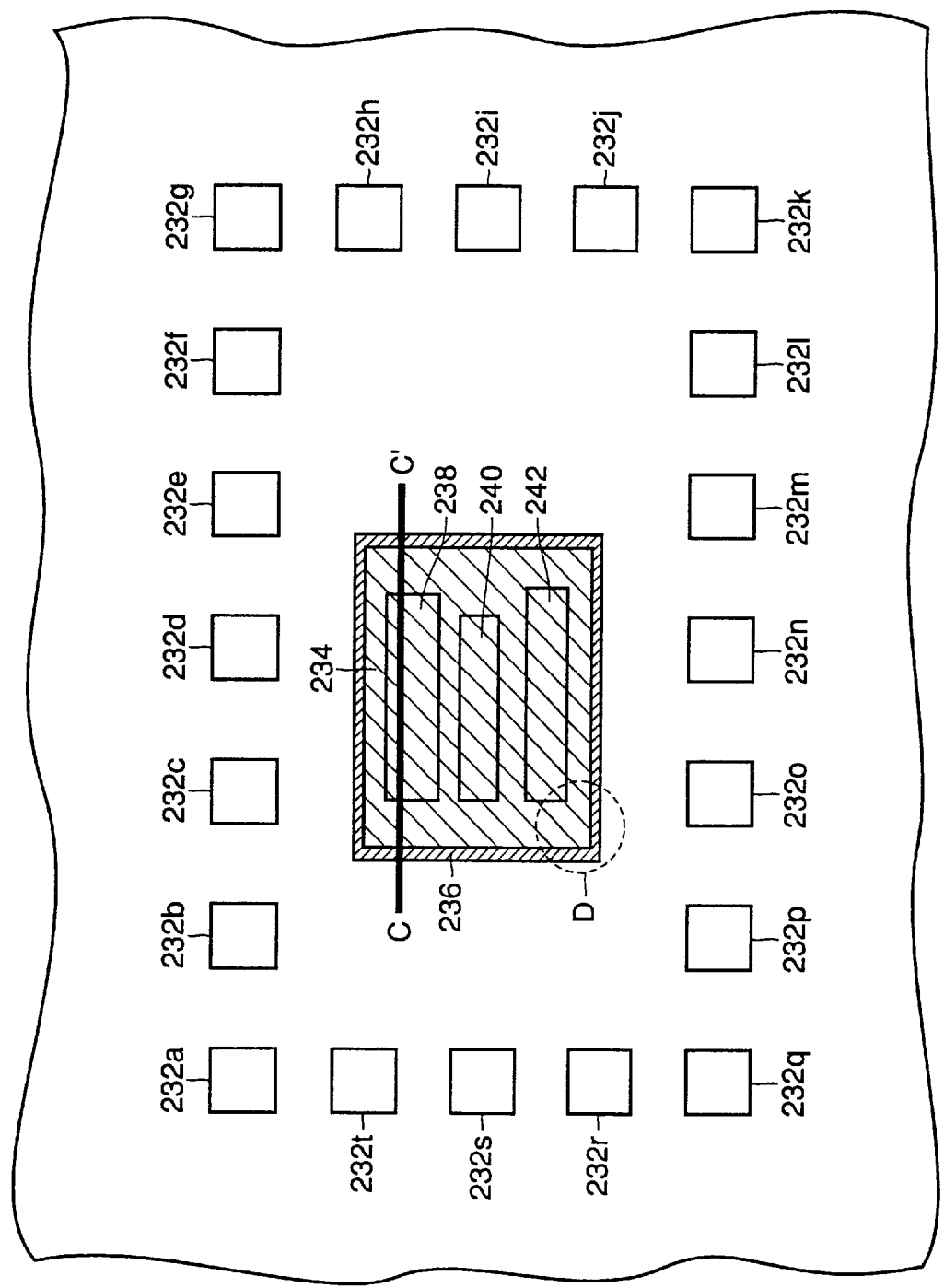
FIG. 16 is a schematic diagram showing an arrangement of a central portion of the semiconductor memory device in accordance with the fifth embodiment.

FIG. 16 is a diagram showing an arrangement of a portion corresponding to peripheral circuits surrounded by the pads of the semiconductor memory device of the fifth embodiment.

Referring to FIG. 16, pads 232a to 232t are arranged along the sides of a rectangle. In the central portion surrounded by pads 232a to 232t, an oscillation circuit 238 and power supply circuits 240 and 242 are concentrated. These oscillation circuit and power supply circuits may be noise generation sources. The periphery of the region in which oscillation circuit 238 and power supply circuits 240 and 242 are arranged is surrounded by a region 236 which is fixed for example at the ground potential. A metal interconnection and a contact hole are formed on region 236 which are fixed at the ground potential.

FIG. 16 is shown as provided with a two-layered metal interconnection formed in this region.

Then, after chip formation, a shield plate formed of metal such as aluminum is provided to cover the region surrounded by the second metal interconnection which is fixed at the ground potential from thereabove.

Figure 17:
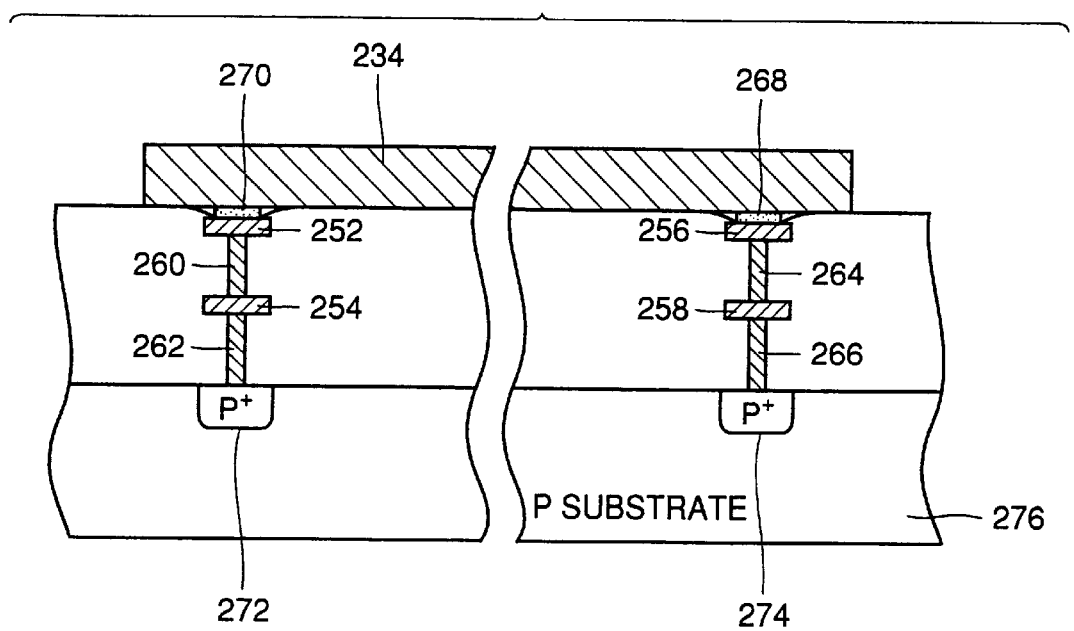
FIG. 17 is a view showing a cross section taken along the line C–C' in FIG. 16.

Referring to FIG. 17, P type impurity regions 272 and 274 are formed in a P substrate 276 which are fixed at the ground potential. First metal interconnections 254 and 258 are respectively formed above P type impurity regions 272 and 274 and connected thereto through contact holes 262 and 266.

Second metal interconnections 252 and 256 are respectively formed above first metal interconnections 254 and 258. Second metal interconnections 252 and 256 are respectively connected to first metal interconnections 254 and 258 through via holes 260 and 264. A protection film for the semiconductor device above second metal interconnections 252 and 256 has been removed, and conductive adhesive 270 and 268 are applied thereon.

Silver paste or the like is employed for the conductive adhesive, for example.

Then, second metal interconnections 252 and 256 and a shield plate 234 are connected through conductive adhesive 270 and 268.

With such structure, the ground potential is applied to metal shield plate 234.

While the case where the ground potential is applied to the metal shield plate is shown in FIG. 17, the potential of shield plate 234 may be any stable potential, such as the substrate potential or power supply potential.

Figure 18:
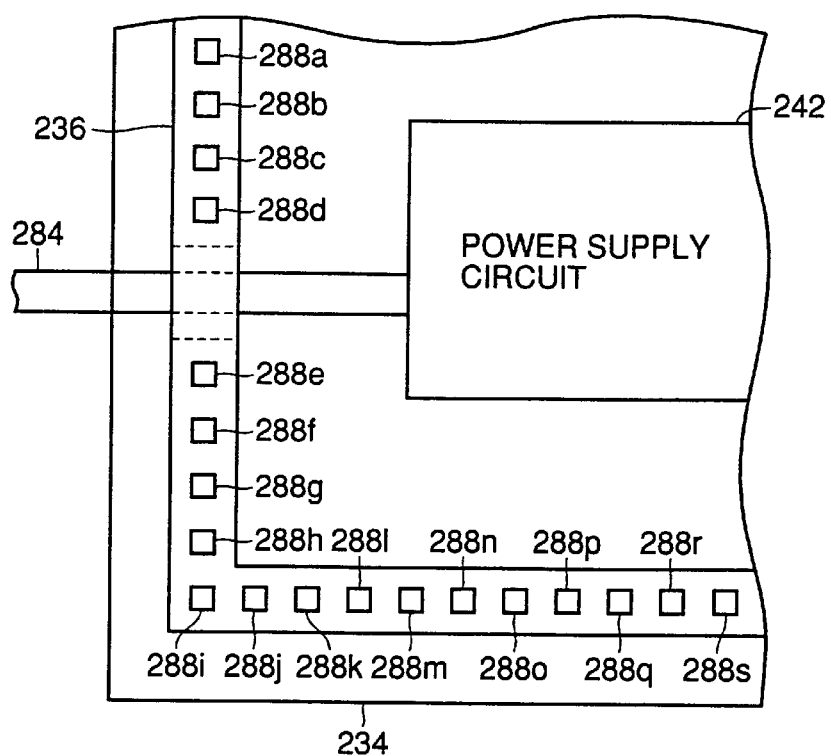
FIG. 18 is a diagram showing in enlargement a portion D in FIG. 16.
Figure 19:
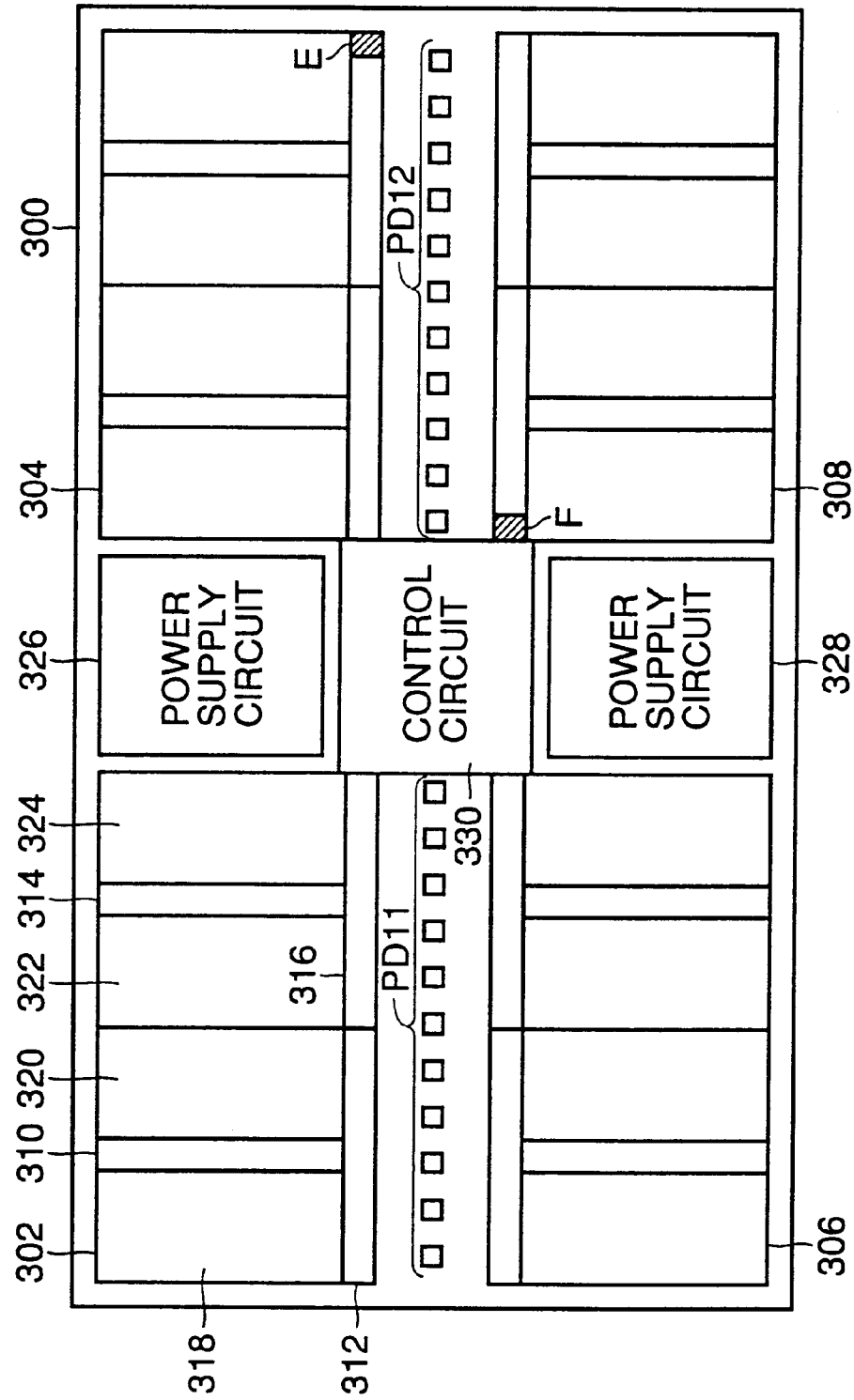
FIG. 19 is a schematic diagram showing a circuit arrangement of a conventional DRAM 300.
Figure 20:
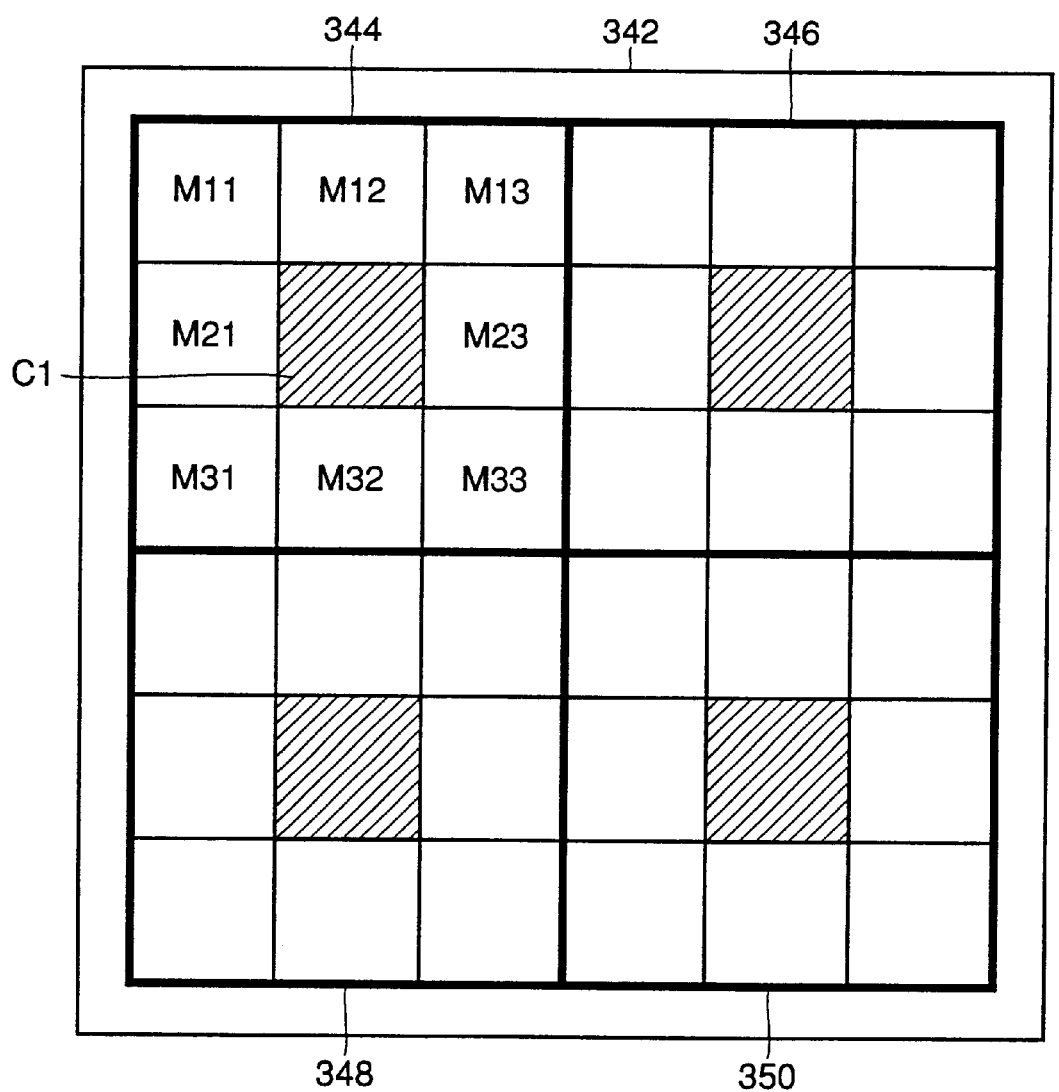
FIG. 20 is a schematic diagram shown in conjunction with a circuit arrangement of a conventional DRAM 342.

Referring to FIGS. 17 and 18, power supply circuit 242 supplies the power supply potential for outside the region 236 with first and second metal interconnections to which the ground potential is applied through first metal interconnection 284. Composite contacts 288a to 288s are formed in region 236 which are formed with aligned contact hole 262 and via hole 260. In the portion of region 236 through which first metal interconnection 284 passes, the first metal interconnection is not formed. Then, shield plate 234 which is slightly larger than region 236 in size is adhesively provided to cover power supply circuit 242.

With such structure, noise (for example very weak electric wave or the like) due to a high frequency signal generated within region 236 is effectively shielded by the metal interconnections or the contact and via holes formed in region 236, so that transmission of noise to the memory cell in the memory array and hence to other semiconductor devices in the same equipment is prevented.

In addition, even when noise (for example very weak electric wave or the like) is externally applied, the oscillation circuit or the like is not readily influenced.

It is noted that while the arrangement in which the pads are provided along the sides of the rectangle has been employed in the description of the embodiments, a similar effect can also be obtained if the pads are arranged only along longer or shorter sides, or if a different type of impurity is employed for a substrate or the memory cell.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device formed on a main surface of a semiconductor substrate, comprising:

a first internal circuit including data holding circuitry;

a second internal circuit being a noise generation source for said first internal circuit;

a noise absorbing portion of said semiconductor substrate having a surface region with a boundary surrounding said second internal circuit on said main surface; and a plurality of pads at least partially overlapping said surface region and each externally communicating a signal, wherein:

said semiconductor substrate is of a first conductivity type said second internal circuit includes a first well of said first conductivity type and an MOS transistor of a second conductivity type formed in said first well, and said noise absorbing portion includes a second well of said second conductivity type formed to surround said first well except for said main surface of said semiconductor substrate.

2. A semiconductor memory device formed on a main surface of a semiconductor substrate, comprising:

a first internal circuit including data holding circuitry;

a second internal circuit being a noise generation source for said first internal circuit;

a noise absorbing portion of said semiconductor substrate having a surface region with a boundary surrounding said second internal circuit on said main surface, and a plurality of pads at least partially overlapping said surface region and each externally communicating a signal, wherein said semiconductor substrate is of a first conductivity type, and said first internal circuit includes a first well of said first conductivity type in which said data holding circuitry is formed, and said noise absorbing portion includes a second well of a second conductivity type formed to surround said first well except for said main surface of said semiconductor substrate.

3. A semiconductor memory device formed on a main surface of semiconductor substrate, comprising:

a first internal circuit including data holding circuitry;

a second internal circuit being a noise generation source for said first internal circuit;

a noise absorbing portion of said semiconductor substrate having a surface region with a boundary surrounding said second internal circuit on said main surface;

a conductive supporting member provided to be electrically connected to said noise absorbing portion on said surface region;

a shield plate supported by said conductive supporting member to cover said second internal circuit; and conductive adhesion means for adhesively fixing and electrically connecting said shield plate to said conductive supporting member.

4. The semiconductor memory device according to claim 1, wherein said plurality of pads include two opposite lines of pads, and said second internal circuit is arranged between said two opposite lines of pads.

5. The semiconductor memory device according to claim 1, wherein said second internal circuit includes internal power supply potential generation circuitry.

6. The semiconductor memory device according to claim 1, wherein said second internal circuit includes peripheral circuitry.

7. The semiconductor memory device according to claim 1, wherein said second internal circuit includes an input buffer.

8. The semiconductor memory device according to claim 1, wherein said second internal circuit includes an output buffer.

9. The semiconductor memory device according to claim 3, wherein said second internal circuit includes internal power supply potential generation circuitry.

10. The semiconductor memory device according to claim 3, wherein said second internal circuit includes oscillation circuitry.

11. The semiconductor memory device according to claim 3, wherein said second internal circuit includes an input buffer.

12. The semiconductor memory device according to claim 3, wherein said second internal circuit includes an output buffer.

13. The semiconductor memory device according to claim 2, wherein said plurality of pads include two opposite lines of pads, and said second internal circuit is arranged between said two opposite lines of pads.

14. The semiconductor memory device according to claim 2, wherein said second internal circuit includes internal power supply potential generation circuitry.

* * * * *